United States Patent
Lin et al.

(10) Patent No.: US 7,314,689 B2
(45) Date of Patent: Jan. 1, 2008

(54) SYSTEM AND METHOD FOR PROCESSING MASKS WITH OBLIQUE FEATURES

(75) Inventors: Burn Jeng Lin, Hsin chu (TW); Ping Yang, Kao-Hsing (TW); Hong Chang Hsieh, Hsin-chu (TW); Yao Ching Ku, Hsin-chu (TW); Chin Hsian Lin, Hsin-chu (TW); Chiu Shan Yoo, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 501 days.

(21) Appl. No.: 10/765,531

(22) Filed: Jan. 27, 2004

(65) Prior Publication Data

US 2005/0164098 A1    Jul. 28, 2005

(51) Int. Cl.
*G03F 1/00* (2006.01)
*G03C 5/00* (2006.01)

(52) U.S. Cl. .................................. 430/5; 430/394
(58) Field of Classification Search ............. 430/5, 430/394; 355/53, 72
See application file for complete search history.

(56) References Cited

U.S. PATENT DOCUMENTS

| 5,969,800 A | * | 10/1999 | Makinouchi | ............. 355/53 |
| 7,094,312 B2 | * | 8/2006 | Libby et al. | ........... 156/345.39 |
| 2002/0028399 A1 | * | 3/2002 | Nakasuji et al. | ............. 430/30 |

OTHER PUBLICATIONS

Mutsunori Igarashi et al., "A Diagonal-Interconnect Architecture and its Application to RISC Core Design", ISSCC 2002, Session 12a, 3 pages.

* cited by examiner

*Primary Examiner*—S. Rosasco
(74) *Attorney, Agent, or Firm*—Duane Morris LLP (57) ABSTRACT

A method and system is disclosed for processing one or more oblique features on a mask or reticle substrate. After aligning the mask or reticle substrate with a predetermined reference system, an offset angle of a feature to be processed on the mask or reticle substrate with regard to either the horizontal or vertical reference direction of the predetermined reference system is determined. The mask or reticle substrate is rotated in a predetermined direction by the offset angle; and the feature on the mask or reticle substrate is processed using the predetermined reference system wherein the feature is processed in either the horizontal or vertical reference direction thereof.

25 Claims, 7 Drawing Sheets

Figure 4C ered vertically. For example, these tools include metrology tools
SYSTEM AND METHOD FOR PROCESSING MASKS WITH OBLIQUE FEATURES

BACKGROUND

The present disclosure relates generally to semiconductor manufacturing operations, and more particularly to an improved method and system for making photo masks with oblique features to be used in a photolithography process.

Modern microelectronic devices are commonly produced using a photolithographic process to imprint circuit designs on a wafer substrate. In this process, a semiconductor wafer is first coated with a layer of photoresist. This photoresist layer is then exposed to illuminating light with a photomask image (for simplicity, the terms photomask, mask, and reticle will be used interchangeably and with equivalency) and subsequently developed. After the development, the patterned photoresist produces an image of the mask on the wafer. Thereafter, the uppermost layer of the wafer is etched, implanted or otherwise processed, and the remaining photoresist is stripped. For multilayer wafers, the above procedure is then repeated to produce subsequent patterned layers. As such, the quality of the masks are important because it is directly related to the quality of the circuits because the accurate conversion from the circuit design to the semiconductor wafer only happens when there is a quality set of masks.

In the past, for various reasons including consideration for quality control, circuits have been designed to have only horizontal and vertical lines so that they are easy to be produced on wafers. Consequently, there are largely horizontal and vertical lines on the masks. As the circuits are shrunk smaller and smaller, the space on each die of the wafer becomes precious. It is now sometimes desirable to have oblique lines to make connections than using vertical and horizontal lines for the same purpose. Although it is not much trouble to use oblique orientation to layout semiconductor integrated circuits on the design in order to be efficient with the cell size, it is, however, difficult to produce these oblique lines on masks as all the existing mask-making machines are designed for crafting vertical and horizontal lines with critical precision on the mask.

Figure 1:
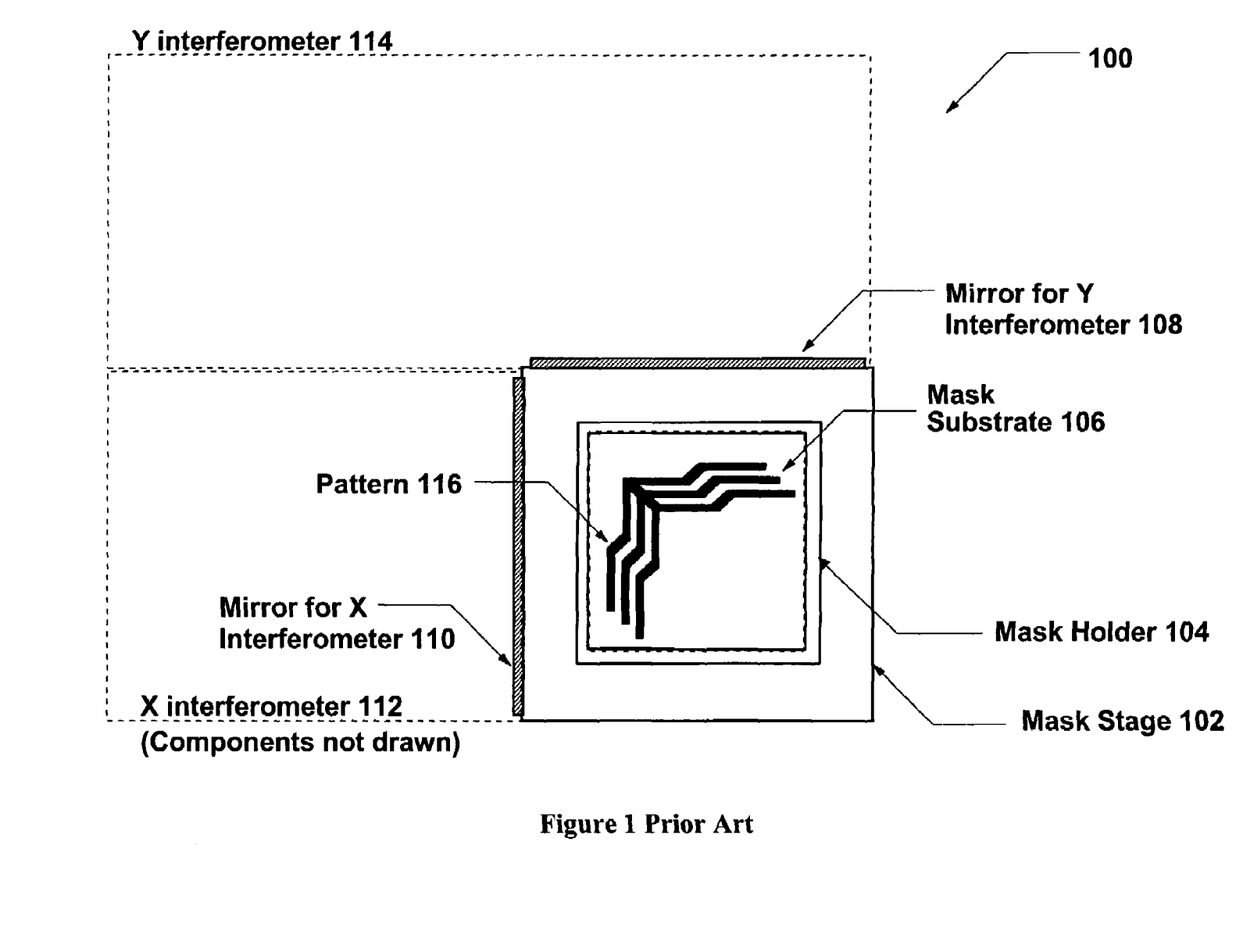
FIG. 1 illustrate a standard mask writer.

FIG. 1 illustrates a top view of a typical mask writer system 100. Since only vertical and horizontal lines are expected to be produced, a mask stage 102, a mask holder 104 on the mask stage, and a blank mask or mask or reticle substrate 106, which is held by the mask holder 104, are all designed to be accurately aligned in both the horizontal reference direction (or X direction) and the vertical reference direction (or Y direction). The alignment of these components can be accomplished by using two mirrors 108 and 110 reflecting lights to an X interferometer 112 and Y interferometer 114. In this conventional configuration, the mask holder 104 is solidly fixed on the mask stage 102 so that when the mask stage is aligned, everything else is also aligned. Once aligned, the mask writer 100 can craft mask pattern 116 on the blank mask as desired. The mask patterns such as the pattern 116 in FIG. 1 may contain oblique features such as oblique lines with respect to the X-Y alignment configuration.

Figure 2A:
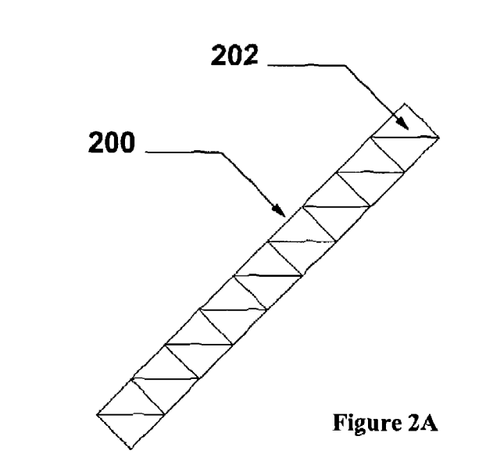
FIG. 2A-2C illustrate conventional methods for crafting oblique features in a mask.
Figure 2B:
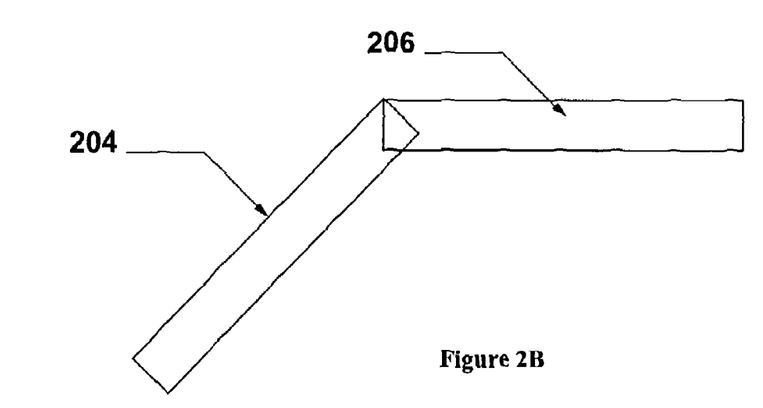
Figure 2C:
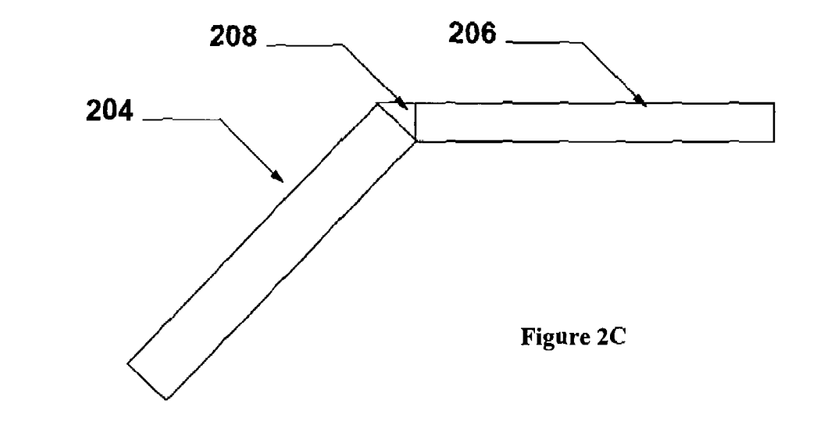

FIGS. 2A-2C illustrate how conventional mask writers handle the oblique lines. Most mask writers handle such oblique lines by combining small oblique patterns together instead of using a large continuous area. For example, as shown in FIG. 2A, an oblique line 200 is formed by numerous triangles 202. As shown in FIGS. 2B and 2C, the connection between an oblique line 204 and a horizontal line 206 (or vertical line) can be done by overlapping these two entities or by adding a third oblique entity such as a triangle 208 in between. Since crafting any oblique entity is time consuming, the throughput of the mask writer and the pattern fidelity of the produced pattern are negatively impacted.

Further, for semiconductor manufacturing tools requiring dimension measurement, the feature of interest is placed vertically. For example, these tools include metrology tools like CDSEM, optical measurement microscopes, mask inspection tools, mask repair tools, and mask verification tools. The dimensions within a range of cross sections are evaluated by either scanning an e-beam or an optical spot across.

Even after a mask is produced, when verifying the quality of the mask, a typical mask verification tool mimics imaging parameters of the mask pattern replication tools. For example, an Aerial Image Simulation (AIMS) tool uses a small field lens having the equivalent numerical aperture together with the same wavelength and illumination condition of the actual wafer-imaging tool that will replicate the mask pattern on wafers. The aerial image from the AIMS tool is examined for critical dimension (CD) control, bridging or breaking. It is understood that if the feature of interest is placed obliquely instead of vertically or horizontally, the measurement is less accurate and more time consuming in view of the fact that the measuring and scanning grids of these tools are all vertically and horizontally oriented. Similarly, the observation and pattern-modification functions in mask repair tools also prefer horizontal and vertical patterns for assuring better accuracy.

Because of the tool limitations, most layout patterns are oriented in horizontal or vertical reference directions. At the very least, all critical patterns are oriented as such. Only patterns of relaxed dimension are allowed to be obliquely oriented. It has been a difficult task to craft oblique critical patterns on a mask.

What is needed is an improved method and system for producing oblique patterns while still maintaining the pattern dimension accuracy so that the produced mask can be used in semiconductor manufacturing operations.

SUMMARY

A method and system is disclosed for processing one or more oblique features on a mask or reticle substrate. After aligning the mask or reticle substrate with a predetermined reference system, an offset angle of a feature to be processed on the mask or reticle substrate with regard to either the horizontal or vertical reference direction of the predetermined reference system is determined. The mask or reticle substrate is rotated in a predetermined direction by the offset angle; and the feature on the mask or reticle substrate is processed using the predetermined reference system wherein the feature is processed in either the horizontal or vertical reference direction thereof.

The present disclosure provides an improved method for providing an effective mask processing method dealing with oblique features. Various benefits are achieved over conventional approaches. For instance, the accuracy for critical oblique patterns is maintained during the mask processing. Moreover, the throughput for a mask processing system is not necessarily hindered by the need for fabricating, examining or otherwise processing oblique critical patterns. As such, the mask processing cycle time for designs with oblique critical patterns is not negatively impacted.

These and other aspects and advantages will become apparent from the following detailed description, taken in conjunction with the accompanying drawings, illustrating by way of example the principles of the disclosure.

DESCRIPTION

A method and system is disclosed for processing masks or reticles with oblique features for semiconductor manufacturing purposes. Although the present disclosure is presented largely in the context of making a mask, it is understood by one skilled in the art that the general concept can be used for examining, verifying, repairing, or modifying the mask.

By selectively rotating a mask substrate, while maintaining regular configurations of a mask processing system such as a mask writer system, the oblique features are processed on the mask substrate. The term "oblique" means any line that is not perpendicular or parallel to an edge of a mask substrate. The term "process" or "processing" in this context intends to include the meaning of making, modifying, examining, verifying, repairing patterns on a mask, or any other similar processing that requires to deal with patterns/features on the mask. Throughout the disclosure, a horizontal-vertical reference system is described as the one used by conventional mask processing systems, and it may be referred to as the X-Y reference system. Similarly, the horizontal reference direction may be referred to as the X direction, and the vertical reference direction the Y direction. It is also understood that the X and Y directions are perpendicular to each other, and they are, in a sense, interchangeable if the perspective of the viewer has changed by 90 degrees. For the purpose of this disclosure, it is assumed that the mask processing tools have clearly defined the X and Y directions. For example, when one loads a blank mask on a mask writing system, there must be one side of the blank mask that is aligned with the X direction. Further, moving directions of a mask stage that holds the mask substrate can also defined the X-Y reference system. This reference system is universally used by various processing tools so that the design features can be precisely and accurately produced on the mask substrate.

In the semiconductor industry, especially the mask making process, various mask making tools prefer vertically and/or horizontally oriented patterns. Embedded in many such mask making tools is an X-Y reference system that only allows lines perpendicular to each other to be produced or examined. Due to this industry wide preference, most circuit designs have their most critical features oriented in the X-Y directions, leaving only the less critical features to have a little flexibility in orientation.

As the technology advances, in some circuit designs, especially with wiring layers, it is preferable to orient the critical connection lines obliquely, most often in a 45 or 135 degree angle with respect to the horizontal or the vertical reference direction. In this case, the dimensions of the vertical and horizontal features may not be as critical as the obliquely positioned lines.

Figure 3A:
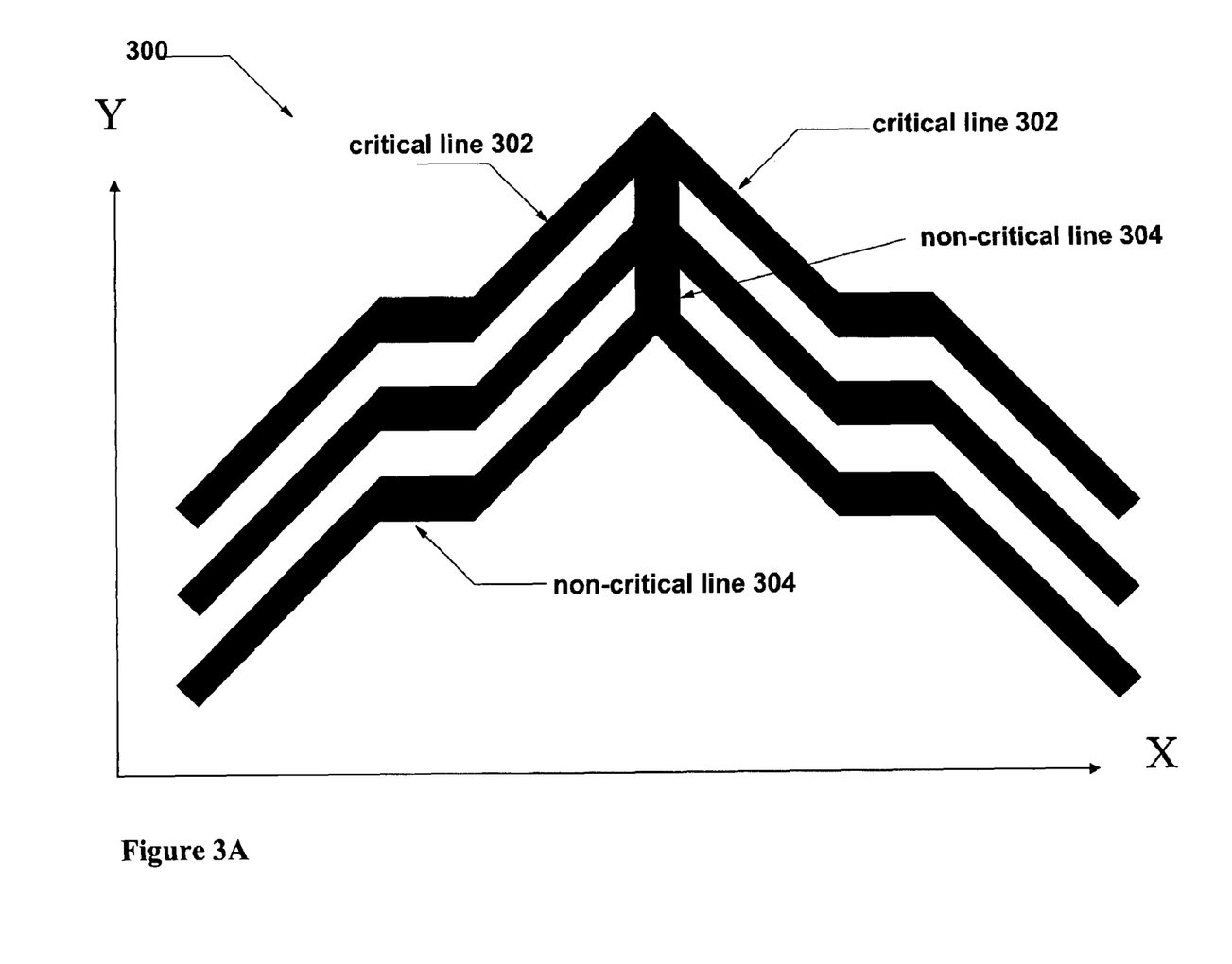
FIG. 3A illustrates a mask pattern containing critical oblique connecting lines and less critical vertical and horizontal lines.

FIG. 3A illustrates a mask pattern 300 which has obliquely positioned lines 302 with critical dimensions while vertical or horizontal lines 304 actually are allowed to have much less critical dimensions. Through the mask pattern design files, it is possible to determine how much an offset angle there is between the oblique line with regard to either the horizontal or vertical reference direction. The offset angle is most often to be about 45 or 135 degrees.

The conventional mask writing methods as described in FIGS. 2A-2C are not satisfactory due to the inaccuracy of the critical features and deficiency of the mask making process. The present disclosure presents an improved writing and/or measuring method for the oblique lines of the mask pattern by using the existing mask making tools with their X-Y reference system. Modifications will be made to allow the rotation of a blank mask substrate so that the oblique features become either horizontal or vertical features.

Figure 3B:
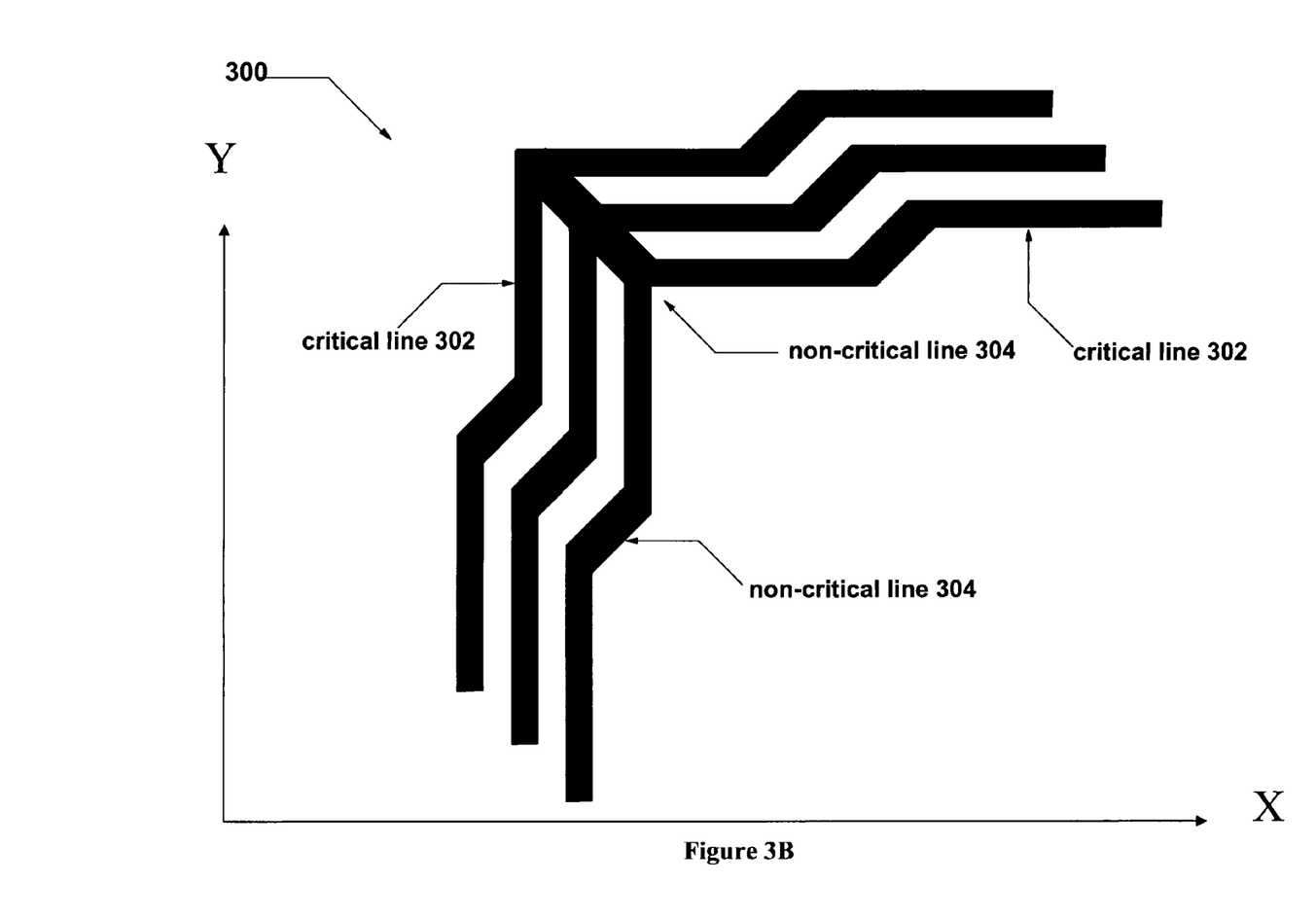
FIG. 3B illustrates the mask pattern of FIG. 3A after the mask substrate is rotated according to one example of the present disclosure.

FIG. 3B illustrates the mask pattern 300 that has been rotated 90 degrees so that the oblique lines in FIG. 3A are now positioned either horizontally or vertically. In this example, when the circuit pattern has critical features lining up in the 45 and 135 degree directions as shown in FIG. 2, the mask substrate is processed with it being rotated by 45 degrees. More details are described below for arranging the mask making tool to achieve the desired result.

Figure 4A:
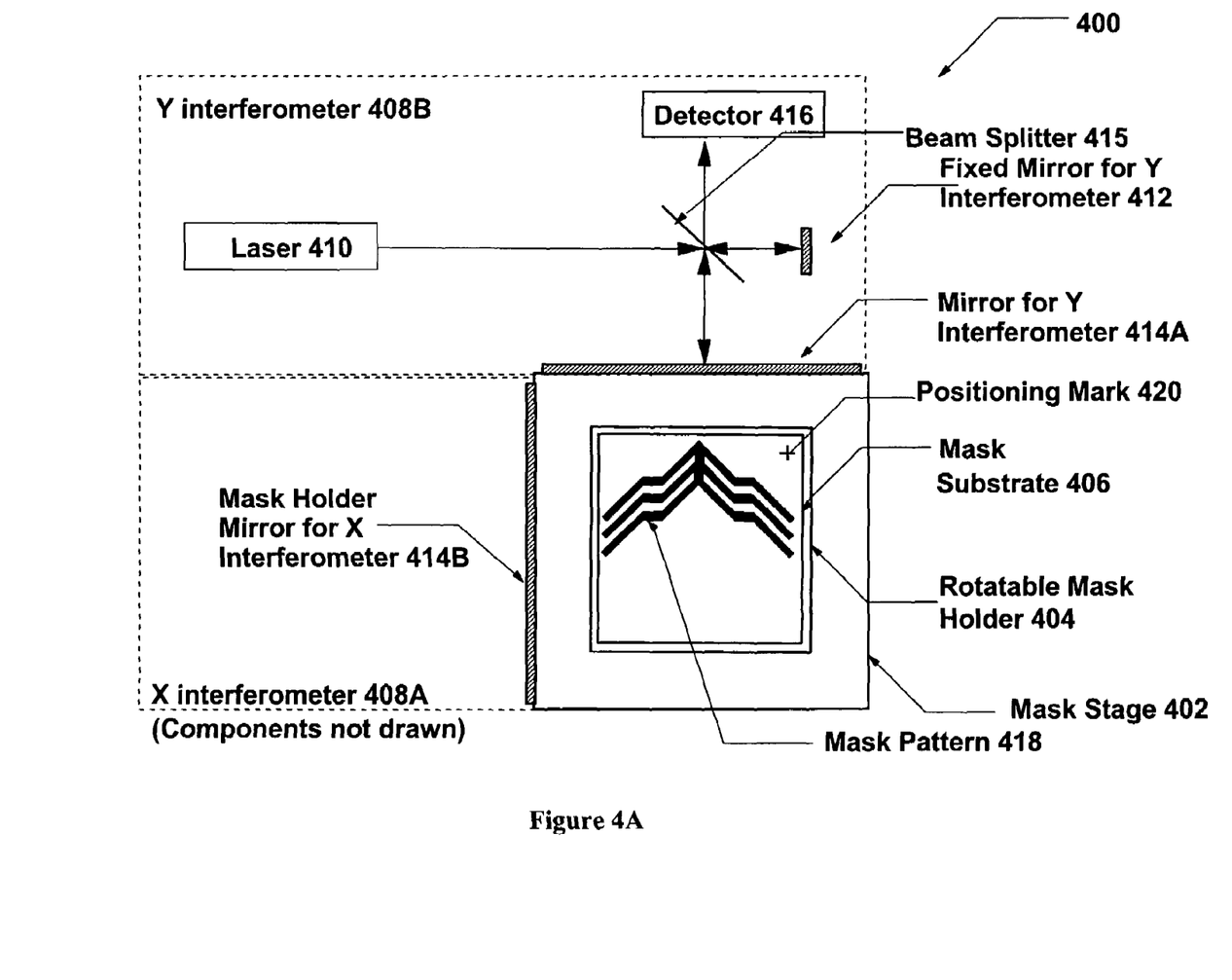
FIG. 4A illustrates expected oblique features to be crafted on a horizontally and vertically aligned mask substrate.

FIG. 4A illustrates a top view of a mask making tool 400. Various components of the mask making tool 400 is eliminated for simplifying the illustration here. The mask making tool 400 has a mask stage 402, whose position is fixed on the mask making tool 400, and a rotatable mask holder 404, which holds a mask substrate or a blank mask 406. The mask stage itself defines a predetermined reference system since it usually moves in either the vertical ("Y") or horizontal ("X") direction. As such, the moving routes of the mask stage define the X and Y reference directions of the reference system. The X and Y directions in which the mask stage moves are maintained mechanically by high precision rails, tracks, bearings, etc. The rotatable mask holder 404, on the other side, can rotate the mask held to an offset angle from the X or Y direction of the reference system. The mask making tool 400 also has an optical alignment subsystem for sensing and aligning the position of the mask stage 402 with X and Y interferometers 408A and 408B. A light source such as a laser generator 410 generates a light to be bounced on a fixed mirror 412 and another mirror 414A attached to the mask stage 402 by using a beam splitter 415. The interference of the bounced light beams are then sensed by a detector 416 so that the vertical position of the mask stage is evaluated. It is noticed that there is another mirror 414B attached to the mask stage 402 for the X interferometer for position measurement in the horizontal reference direction. Orthogonal movement is established when a change of position in X does not change the position in Y and vice versa.

As shown in FIG. 4A, a mask pattern 418 like the one in FIG. 3A is expected to be made on the mask substrate. There are also one or more position marks 420 on the mask holder to keep track of the relative position between the stage and pre-written patterns on the mask for registration of written patterns between exposures in a multiple-exposure situation.

Figure 4B:
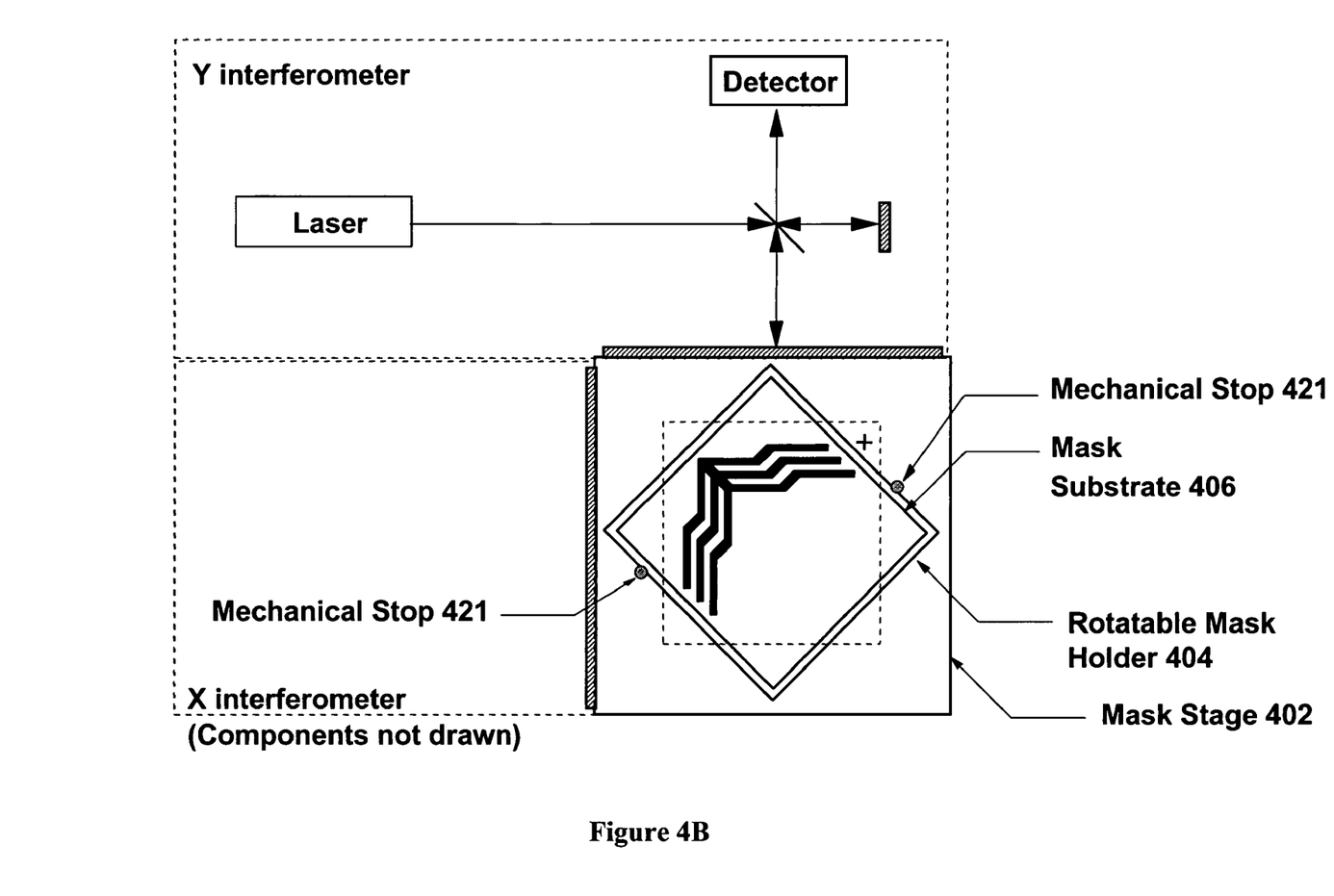
FIG. 4B illustrates a method for crafting the oblique features by rotating the mask substrate according to one example of the present disclosure.

FIG. 4B illustrates the same mask making tool 400 as in FIG. 4A except that the mask substrate 406 and the mask holder 404 are rotated towards the left by 45 degrees. As shown, the mask stage 402 is not rotated and maintains its position and alignment with respect to the X and Y interferometers. The mask substrate 406 is rotated by rotating the mask holder 404, wherein its position with regard to the mask holder is not changed at all. One or more fixed mechanical stoppers 421 may be built on the mask stage so that the mask holder can be rotated to predetermined angles consistently. Since the design source for the mask pattern 418 in FIG. 4A can now be rotated to make the critical features aligned with the X or Y directions, the end result is that the mask pattern 418 is created on the blank mask 406 as desired using the standard horizontal and vertical line making processes. None of the methods illustrated in FIG. 2A-2C will be needed.

Even though the mask substrate is rotated to be in an oblique orientation, the mask stage 402 still moves in vertical and horizontal reference directions in the mask-making tool 400. Therefore, the position monitoring device such as the mirror for the laser interferometers 412 and 414A-B remains in the position to monitor vertical and horizontal positions.

Figure 4C:
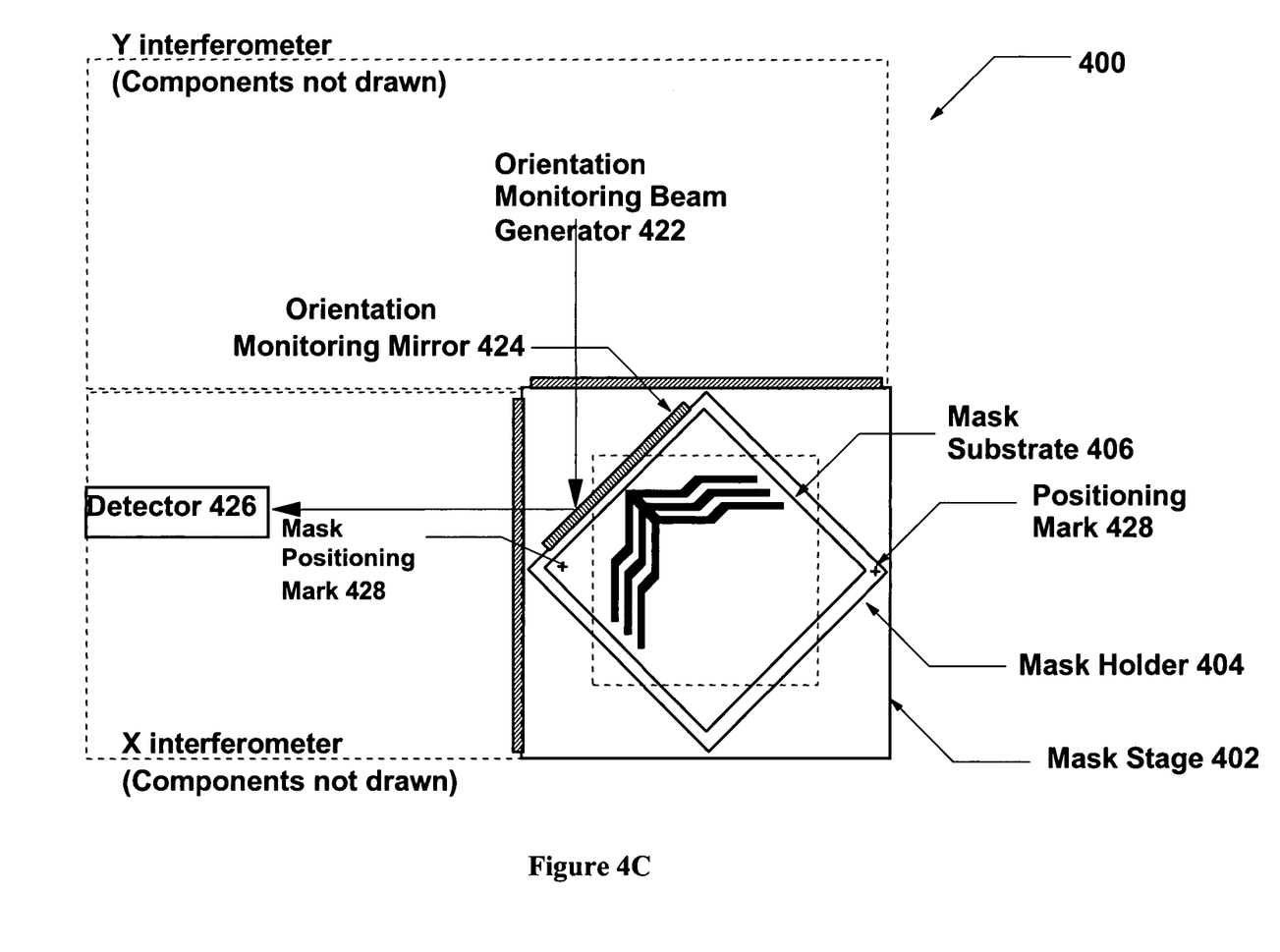
FIG. 4C illustrates an improved mask making tool for crafting the oblique features by rotating the mask substrate with an orientation monitoring system according to one example of the present disclosure.

FIG. 4C illustrates the mask making tool 400 with an orientation monitoring subsystem according to one example of the present disclosure. It would be most flexible when the orientation of the mask substrate 406 can be changed in the mask making process. This can be done by using the mask holder 404 with a mask substrate orientation monitoring subsystem such as an orientation monitoring beam generator 422, an orientation monitoring mirror 424 attached to the mask holder 404, and an orientation detector 426. Through the orientation monitoring beam reflection on the orientation monitoring mirror 424, the detector 426 can detect whether the mask holder 404 has be aligned to a desired angle. In addition, one or more position marks 428 can be put on the holder and/or mask substrate to allow the mask writing tool 400 to track the settled position of the mask substrate after each reposition.

With an appropriately designed orientation monitoring subsystem, the mask holder can be rotated to any position desired as long as the offset angle is determined, the angle being defined by the oblique line and either the horizontal or vertical reference direction of the reference system of the mask making tool. As such, any oblique features on a desired mask can be generated by the mask making tool using the standard processes only by rotating the mask substrate on the mask stage.

The present invention as described above thus provides an improved method for providing an effective mask processing method dealing with oblique features. Various benefits are achieved over conventional approaches. For instance, in the context of mask making process, the accuracy for critical oblique patterns is maintained during the mask making process. Moreover, the throughput for the mask making process is not necessarily hindered by the need for fabricating oblique critical patterns. As such, the mask making cycle time for designs with oblique critical patterns is not negatively impacted. These benefits equally apply to other mask processing systems that have to deal with oblique features.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for processing one or more oblique features on a mask or reticle substrate, the method comprising:
   aligning the mask or reticle substrate with a predetermined reference system;
   determining an offset angle of a feature to be processed on the mask or reticle substrate with regard to either a first reference direction or a second reference direction perpendicular to the first reference direction of the predetermined reference system;
   rotating the mask or reticle substrate in a predetermined direction by the offset angle; and
   processing the feature on the mask or reticle substrate according to the predetermined reference system wherein the feature is processed in either the horizontal or vertical reference direction of the predetermined reference system and at the offset angle with respect to an edge of the mask or reticle substrate,
   wherein the processing the feature comprises writing a mask pattern.

2. The method of claim 1 the aligning further includes positioning the mask or reticle substrate on a mask holder, the mask holder being on a mask stage of a mask processing tool.

3. The method of claim 2 wherein the predetermined reference system is defined by moving directions of the mask stage.

4. The method of claim 2 wherein the rotating further includes rotating the aligned mask holder by the offset angle.

5. The method of claim 2 wherein the rotating further includes using one or more stoppers on the mask stage for stopping the mask holder.

6. The method of claim 1 wherein the processing further includes forming or repairing the feature on the mask or reticle substrate.

7. The method of claim 1 wherein the processing further includes inspecting or verifying the feature on the mask or reticle substrate.

8. The method of claim 1 wherein the offset angle is about 45 degrees from either the first or second reference direction.

9. A mask processing system comprising:
   means for receiving a mask or reticle substrate according to a predetermined reference system;
   means for determining an offset angle of a feature to be processed on the mask or reticle substrate with regard to either a horizontal or vertical reference direction of the predetermined reference system;
   means for rotating the mask or reticle substrate in a predetermined direction by the offset angle; and
   means for processing the feature on the mask or reticle substrate according to the predetermined reference system wherein the feature is processed in either the horizontal or vertical reference direction of the predetermined reference system and at the offset angle with respect to an edge of the mask or reticle substrate, wherein the means for processing the feature comprise means for writing a mask pattern.

10. The processing system of claim 9, wherein the means for processing the feature further comprise mask repairing means.

11. The processing system of claim 9, wherein the mask processing system comprises a verification tool or an inspection tool.

12. The processing system of claim 9 wherein the means for rotating further includes a rotatable mask holder.

13. The processing system of claim 9 wherein the means for receiving further includes a mask stage whose moving directions define the predetermined reference system.

14. The processing system of claim 9 further comprising a mask or reticle substrate orientation monitoring subsystem for monitoring the position of the mask or reticle substrate.

15. The processing system of claim 9 wherein the offset angle is about 45 degrees with regard to either the horizontal or vertical reference direction.

16. A method for processing one or more oblique features on a mask or reticle substrate, the method comprising:
    positioning the mask or reticle substrate on a rotatable mask holder on a mask stage;
    aligning the mask or reticle substrate with a predetermined reference system defined by moving directions of the mask stage so that at least one side of the mask or reticle substrate is in a horizontal reference direction of the reference system;
    determining a first offset angle of a first feature to be processed on me mask or reticle substrate with regard to either the horizontal or vertical reference direction of the predetermined reference system;
    rotating the mask holder in a predetermined direction by the first offset angle; and
    processing the first feature on the mask or reticle substrate according to the predetermined reference system wherein the first feature is processed in either the horizontal or vertical reference direction of the predetermined reference system and the feature formed at an oblique angle with respect to the side of the mask or reticle substrate,
    wherein the processing comprises writing a mask pattern.

17. The method of claim 16 further comprising:
    determining a second offset angle of a second feature to be processed on the mask or reticle substrate with regard to either the horizontal or vertical reference direction of the predetermined reference system;
    rotating the mask holder to a desired orientation based on the first and second offset angles; and
    processing the feature on the mask or reticle substrate according to the predetermined reference system wherein the second feature is processed in either the horizontal or vertical reference direction thereof.

18. The method of claim 16 further comprising monitoring the position of the mask or reticle substrate according to the predetermined reference system.

19. The method of claim 16 wherein the rotating further includes rotating the mask holder by using one or more mechanical stoppers on the mask stage.

20. The method of claim 16 wherein the rotating further includes rotating the mask holder by using an optical position monitoring subsystem.

21. A mask processing system comprising:
    a mask stage for aligning a mask or reticle substrate wherein one side of the mask or reticle substrate is parallel to a horizontal reference direction of a predetermined reference system;
    a processing module for determining an offset angle of a feature to be created on the mask or reticle substrate with regard to either the horizontal or vertical reference direction;
    a mask holder for rotating the mask or reticle substrate in a predetermined direction by the offset angle;
    a mask or reticle substrate orientation monitoring subsystem for monitoring the position of the mask or reticle substrate; and
    a mask processing module utilizing the predetermined reference system for creating the feature on the mask or reticle substrate wherein the feature is created in either the horizontal or vertical reference direction of the predetermined reference system and at an oblique angle with respect to the one side of the mask or reticle substrate,
    wherein the mask processing module is a mask writing tool.

22. The processing system of claim 21 wherein the mask processing module further comprises a mask repairing tool.

23. The processing system of claim 21 wherein the mask processing module further comprises a verification tool or an inspection tool.

24. The processing system of claim 21 wherein the mask stage further includes one or more orientation monitoring subsystem for aligning the mask stage according to the horizontal or vertical reference direction.

25. The processing system of claim 21 wherein the offset angle is about 45 degrees with regard to either the horizontal or vertical reference direction.

* * * * *

UNITED STATES PATENT AND TRADEMARK OFFICE
CERTIFICATE OF CORRECTION

PATENT NO. : 7,314,689 B2
APPLICATION NO. : 10/765531
DATED : January 1, 2008
INVENTOR(S) : Burn Jeng Lin et al.

It is certified that error appears in the above-identified patent and that said Letters Patent is hereby corrected as shown below:

On the title page, item (75) Inventors: delete "Chin Hsian Lin" and insert -- Chin Hsiang Lin -- therefor.

Column 7, line 30, delete "me" and insert -- the -- therefor.

Signed and Sealed this

Sixth Day of May, 2008

JON W. DUDAS
*Director of the United States Patent and Trademark Office*